US012604769B2

(12) United States Patent
Kong et al.

(10) Patent No.: US 12,604,769 B2
(45) Date of Patent: Apr. 14, 2026

(54) BACKLIGHT UNIT AND DISPLAY DEVICE INCLUDING THE SAME

(71) Applicant: LG Display Co., Ltd., Seoul (KR)

(72) Inventors: ChangKyeong Kong, Paju-si (KR); Sangmin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 697 days.

(21) Appl. No.: 17/974,389

(22) Filed: Oct. 26, 2022

(65) Prior Publication Data

US 2023/0170342 A1 Jun. 1, 2023

(30) Foreign Application Priority Data

Nov. 30, 2021 (KR) ........................ 10-2021-0169474

(51) Int. Cl.
H01L 25/16 (2023.01)
G02F 1/1335 (2006.01)
(Continued)

(52) U.S. Cl.
CPC ...... H01L 25/167 (2013.01); G02F 1/133612 (2021.01); G02F 1/133621 (2013.01); H01L 24/02 (2013.01); H01L 24/05 (2013.01); H01L 24/06 (2013.01); H01L 24/16 (2013.01); H10H 20/857 (2025.01); H01L 25/165 (2013.01);
(Continued)

(58) Field of Classification Search
CPC . H01L 2224/05073; H01L 2224/05639; H01L 2224/05644; H01L 2224/05647; H01L 2224/05666; H01L 2224/05671; H01L 2224/0568; H01L 2224/05681; H01L 2224/05684; H01L 24/06; G02F 1/1309
See application file for complete search history.

(56) References Cited

U.S. PATENT DOCUMENTS 7,787,068 B2 8/2010 Choi et al.
8,987,765 B2 3/2015 Bibl et al.
(Continued)

FOREIGN PATENT DOCUMENTS

CN 105324858 A 2/2016
CN 108267891 A 7/2018
(Continued)

OTHER PUBLICATIONS

Korean Intellectual Property Office, Office Action, Korean Patent Application No. 10-2021-0169474, Jan. 22, 2025, eight pages, (with concise explanation of relevance).
(Continued)

*Primary Examiner* — Wael M Fahmy
*Assistant Examiner* — Fernando Jose Ramos-Diaz
(74) *Attorney, Agent, or Firm* — Fenwick & West LLP

(57) ABSTRACT

A backlight unit and a display device including the same are disclosed. More specifically, a backlight unit is disclosed that includes a plurality of light sources disposed on a glass substrate and disposed in a plurality of rows and a plurality of columns, and first and second transistors disposed on the glass substrate and spaced apart from each other, wherein each of the first transistor and the second transistor is disposed so as not to overlap the plurality of light sources disposed at points where two rows and two columns cross each other. Thus, image quality is excellent.

18 Claims, 16 Drawing Sheets

(51) Int. Cl.
    *G02F 1/13357*     (2006.01)
    *H01L 23/00*     (2006.01)
    *H10H 20/857*     (2025.01)

(52) U.S. Cl.
    CPC ............... *H01L 2224/02145* (2013.01); *H01L 2224/05073* (2013.01); *H01L 2224/05552* (2013.01); *H01L 2224/05558* (2013.01); *H01L 2224/05566* (2013.01); *H01L 2224/05573* (2013.01); *H01L 2224/05624* (2013.01); *H01L 2224/05639* (2013.01); *H01L 2224/05644* (2013.01); *H01L 2224/05647* (2013.01); *H01L 2224/05666* (2013.01); *H01L 2224/05671* (2013.01); *H01L 2224/0568* (2013.01); *H01L 2224/05681* (2013.01); *H01L 2224/05684* (2013.01); *H01L 2224/0616* (2013.01); *H01L 2224/16147* (2013.01); *H01L 2924/12041* (2013.01)

(56) References Cited

U.S. PATENT DOCUMENTS

| | | | |
|---|---|---|---|
| 9,214,107 B2 | 12/2015 | Fish et al. | |
| 9,240,397 B2 | 1/2016 | Bibl et al. | |
| 9,570,427 B2 | 2/2017 | Bibl et al. | |
| 9,876,000 B2 | 1/2018 | Bibl et al. | |
| 10,256,221 B2 | 4/2019 | Bibl et al. | |
| 10,573,629 B2 | 2/2020 | Bibl et al. | |
| 10,573,632 B2 | 2/2020 | Yeon et al. | |
| 10,797,040 B2 | 10/2020 | Yeon et al. | |
| 10,816,849 B2 | 10/2020 | Lee et al. | |
| 10,930,630 B2 | 2/2021 | Choi et al. | |
| 10,971,058 B1 | 4/2021 | Cheng et al. | |
| 11,004,836 B2 | 5/2021 | Bibl et al. | |
| 11,444,066 B2 | 9/2022 | Jung et al. | |
| 11,676,952 B2 | 6/2023 | Bibl et al. | |
| 2006/0256048 A1 | 11/2006 | Fish et al. | |
| 2007/0159571 A1* | 7/2007 | Yang ................. | G02F 1/136259 349/54 |
| 2008/0158465 A1* | 7/2008 | Choi ................. | G02F 1/136259 349/54 |
| 2011/0149187 A1 | 6/2011 | Yang | |

| | | | |
|---|---|---|---|
| 2014/0367705 A1 | 12/2014 | Bibl et al. | |
| 2015/0137153 A1 | 5/2015 | Bibl et al. | |
| 2015/0137697 A1 | 5/2015 | Cheng | |
| 2016/0111405 A1 | 4/2016 | Bibl et al. | |
| 2017/0125392 A1 | 5/2017 | Bibl et al. | |
| 2018/0182746 A1 | 6/2018 | Bibl et al. | |
| 2018/0188606 A1 | 7/2018 | Lee et al. | |
| 2018/0356684 A1* | 12/2018 | Chang ............... | G02F 1/133603 |
| 2019/0259739 A1 | 8/2019 | Bibl et al. | |
| 2019/0371779 A1 | 12/2019 | Yeon et al. | |
| 2020/0194417 A1 | 6/2020 | Yeon et al. | |
| 2020/0219863 A1 | 7/2020 | Bibl et al. | |
| 2020/0286872 A1 | 9/2020 | Choi et al. | |
| 2021/0043616 A1* | 2/2021 | Jung ...................... | H10H 20/01 |
| 2021/0134877 A1* | 5/2021 | Kim .................... | H10H 29/142 |
| 2021/0257525 A1* | 8/2021 | Ryu .................... | H01L 25/0753 |
| 2021/0313305 A1 | 10/2021 | Bibl et al. | |
| 2021/0351325 A1 | 11/2021 | Chang et al. | |
| 2022/0393088 A1 | 12/2022 | Kwon et al. | |
| 2024/0014195 A1 | 1/2024 | Bibl et al. | |

FOREIGN PATENT DOCUMENTS

| | | | | |
|---|---|---|---|---|
| CN | 111580304 A | 8/2020 | | |
| CN | 111668174 A | 9/2020 | | |
| CN | 111724699 A | 9/2020 | | |
| CN | 112102735 A | 12/2020 | | |
| CN | 112436000 A | 3/2021 | | |
| CN | 113497073 A | 10/2021 | | |
| JP | 2005-340803 A | 12/2005 | | |
| JP | 2008-165174 A | 7/2008 | | |
| KR | 10-2006-0132795 A | 12/2006 | | |
| KR | 10-2019-0137458 A | 12/2019 | | |
| KR | 10-2021-0081761 A | 7/2021 | | |
| KR | 20210086047 A | * 7/2021 | ......... | H01L 51/5203 |

OTHER PUBLICATIONS

China National Intellectual Property Administration, Notice of Allowance, Chinese Patent Application No. 202211347449.6, Sep. 6, 2024, eight pages.

China National Intellectual Property Administration, Office Action, Chinese Patent Application No. 202211347449.6, Mar. 14, 2024, 21 pages.

\* cited by examiner

BACKLIGHT UNIT AND DISPLAY DEVICE INCLUDING THE SAME

CROSS REFERENCE TO RELATED APPLICATION

This application claims priority from Republic of Korea Patent Application No. 10-2021-0169474, filed on Nov. 30, 2021, which is hereby incorporated by reference in its entirety.

BACKGROUND

1. Field of Technology

Embodiments of the present disclosure relate to a backlight unit and a display device including the same.

2. Description of the Related Art

A display device may include a display panel in which a plurality of sub-pixels are disposed, and various driving circuits for driving elements disposed in the sub-pixels. Further, the display device may include a backlight unit which supplies light to the display panel according to a type of the display device.

The backlight unit may include a plurality of light sources and a plurality of optical members. Further, the display panel may be disposed at an opposite side of a surface of the display panel which displays an image to supply light to the display panel.

SUMMARY

Embodiments of the present disclosure relate to a backlight unit in which an individual light source may be repaired and a phenomenon in which light is scattered or a phenomenon in which a partial region darkly appears may be prevented even when the light source is repaired, and a display device including the same.

Embodiments of the present disclosure relate to a backlight unit having improved image quality by including a light source disposed at a high density on a glass substrate, and a display device including the same.

Embodiments of the present disclosure relate to a backlight unit having a structure in which manufacturing costs may be reduced as a plurality of transistors drive a plurality of light sources, and a display device including the same.

Embodiments of the present disclosure may provide a backlight unit including a plurality of pad electrodes disposed on a glass substrate, a plurality of light sources disposed on the glass substrate and disposed in a plurality of rows and a plurality of columns, and a first transistor and a second transistor disposed on the glass substrate and spaced apart from each other, wherein each of the first transistor and the second transistor is disposed so as not to overlap the plurality of light sources disposed at points where two rows and two columns cross each other, and a display device including the same.

Embodiments of the present disclosure may provide a display device including a substrate of a backlight unit, at least a pair of pad electrodes disposed on the substrate of the backlight unit, a light source disposed on the pair of pad electrodes, a color conversion sheet disposed on the light source, and a display panel disposed on the color conversion sheet, wherein a pair of repair patterns are disposed adjacent to the pair of pad electrodes, and the pair of pad electrodes include a first pad electrode and a second pad electrode spaced apart from the first pad electrode and point-symmetrically located with the first pad electrode, wherein the pair of repair patterns include a first repair pattern adjacent to the first pad electrode and a second repair pattern adjacent to the second pad electrode, the first repair pattern and the second repair pattern are spaced apart from each other and point-symmetrically located, and a reference point at which the first and second pad electrodes are point-symmetrically located and a reference point at which the first and second repair patterns are point-symmetrically located correspond to each other.

Technical Effect

According to embodiments of the present disclosure, it is possible to provide a backlight unit in which an individual light source can be repaired and a phenomenon in which light is scattered or a phenomenon in which a partial region appears dark can be prevented or at least reduced even when the light source is repaired by including a pair of repair patterns adjacent to a pair of pad electrodes, and a display device including the same.

According to embodiments of the present disclosure, it is possible to provide a backlight unit having improved image quality by including a light source disposed at a high density, and a display device including the same.

According to embodiments of the present disclosure, it is possible to provide a backlight unit having a structure in which manufacturing costs can be reduced as a plurality of transistors drive a plurality of light sources, and a display device including the same.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
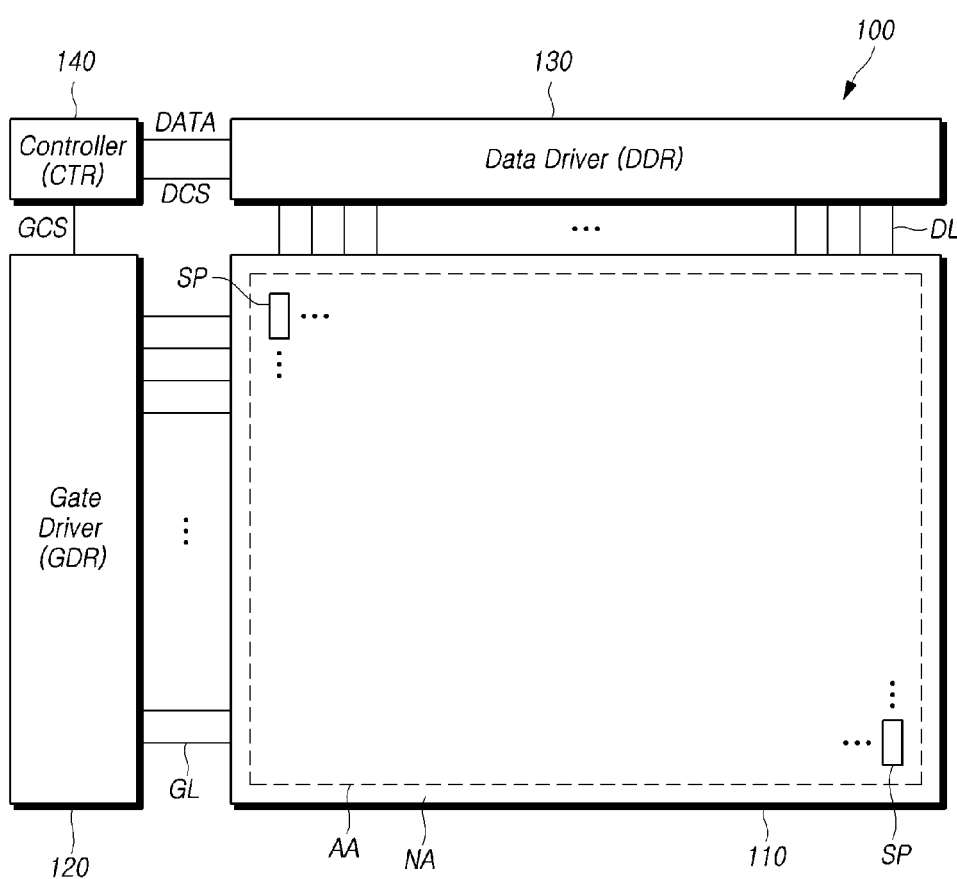
FIG. 1 is a view illustrating a schematic configuration of a display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define the essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings.

FIG. 1 is a view illustrating a schematic configuration of a display device 100 according to embodiments of the present disclosure.

Referring to FIG. 1, the display device 100 may include a display panel 110 including an active region AA and a non-active region NA, and a gate driving circuit 120, a data driving circuit 130, a controller 140, and the like for driving the display panel 110.

A plurality of gate lines GL and a plurality of data lines DL may be disposed in the display panel 110, and sub-pixels SP may be disposed in regions where the gate lines GL and the data lines DL cross each other.

The gate driving circuit 120 is controlled by the controller 140, and sequentially outputs a scan signal to the plurality of gate lines GL disposed in the display panel 110 to control a driving timing of the plurality of sub-pixels SP.

The gate driving circuit 120 may include one or more gate driver integrated circuits (GDICs), and may be located at only one side of the display panel 110 and may also be located at both sides of the display panel 110 according to a driving method.

Each gate driver integrated circuit (GDIC) may be connected to a bonding pad of the display panel 110 by a tape automated bonding (TAB) method or a chip on glass (COG) method, or may be implemented in a gate in panel (GIP) type to be disposed directly on the display panel 110, and may also be integrated and disposed on the display panel 110 in some cases. Further, each gate driver integrated circuit (GDIC) may be implemented in a chip on film (COF) method of being mounted on a film connected to the display panel 110.

The data driving circuit 130 receives image data from the controller 140 and converts the image data to a data voltage in an analog form. Further, since the data voltage is output to each data line DL according to a timing at which the scan signal is applied through the gate line GL, each sub-pixel SP expresses brightness according to the image data.

The data driving circuit 130 may include one or more source driver integrated circuits (SDICs).

Each source driver integrated circuit (SDIC) may include a shift register, a latch circuit, a digital-to-analog converter, an output buffer, and the like.

Each source driver integrated circuit (SDIC) may be connected to a bonding pad of the display panel 110 by a tape automated bonding (TAB) method or a chip on glass (COG) method, or may be disposed directly on the display panel 110, and may also be integrated and disposed on the display panel 110 in some cases. Further, each source driver integrated circuit (SDIC) may be implemented by the chip on film (COF) method, and in this case, each source driver integrated circuit (SDIC) may be mounted on the film connected to the display panel 110, and may be electrically connected to the display panel 110 through lines on the film.

The controller 140 supplies various control signals to the gate driving circuit 120 and the data driving circuit 130, and controls operations of the gate driving circuit 120 and the data driving circuit 130.

The controller 140 may be mounted on a printed circuit board, a flexible printed circuit, and the like, and may be electrically connected to the gate driving circuit 120 and the data driving circuit 130 through the printed circuit board, the flexible printed circuit, and the like.

The controller 140 allows the gate driving circuit 120 to output the scan signal according to a timing implemented in each frame, and converts the image data received from the outside according to a data signal form used in the data driving circuit 130 to output the converted image data to the data driving circuit 130.

The controller 140 receives various timing signals including a vertical synchronization signal (VSYNC), a horizontal synchronization signal (HSYNC), an input data enable signal (DE), a clock signal (CLK), and the like in addition to the image data from the outside (for example, host system).

The controller 140 may generate various control signals using the various timing signals received from the outside and output the control signals to the gate driving circuit 120 and the data driving circuit 130.

For example, in order to control the gate driving circuit 120, the controller 140 outputs various gate control signals (GCSs) including a gate start pulse (GSP), a gate shift clock (GSC), a gate output enable signal (GOE), and the like.

Here, the gate start pulse (GSP) controls an operation start timing of the one or more gate driver integrated circuits (GDICs) constituting the gate driving circuit 120. The gate shift clock (GSC) is a clock signal commonly input to the one or more gate driver integrated circuits (GDICs), and controls a shift timing of the scan signal. The gate output enable signal (GOE) specifies timing information of the one or more gate driver integrated circuits (GDICs).

Further, in order to control the data driving circuit 130, the controller 140 outputs various data control signals (DCSs) including a source start pulse (SSP), a source sampling clock (SSC), and a source output enable signal (SOE), and the like.

Here, the source start pulse (SSP) controls a data sampling start timing of the one or more source driver integrated circuits (SDICs) constituting the data driving circuit 130. The source sampling clock (SSC) is a clock signal which controls a sampling timing of data in each source driver integrated circuit (SDIC). The source output enable signal (SOE) controls an output timing of the data driving circuit 130.

Further, the controller 140 may individually control luminance for each region of the display panel 110 by controlling a light-emitting operation of the backlight unit of the display device 100 through a local dimming technology.

This display device 100 may further include a power management integrated circuit which supplies various voltages or currents to the display panel 110, the gate driving circuit 120, the data driving circuit 130, and the like, or controls various voltages or currents to be supplied.

Each sub-pixel SP may be a region defined by the crossing of the gate line GL and the data line DL, and a liquid crystal or a light-emitting element may be disposed according to a type of the display device 100.

For example, when the display device 100 is a liquid crystal display device, the display device 100 includes a light source device such as a backlight unit which emits light to the display panel 110, and a liquid crystal is disposed on the sub-pixels SP of the display panel 110. Further, since arrangement of the liquid crystal is adjusted by an electric field formed as the data voltage is applied to each sub-pixel SP, the brightness according to the image data may be displayed and an image may be displayed.

Figure 2:
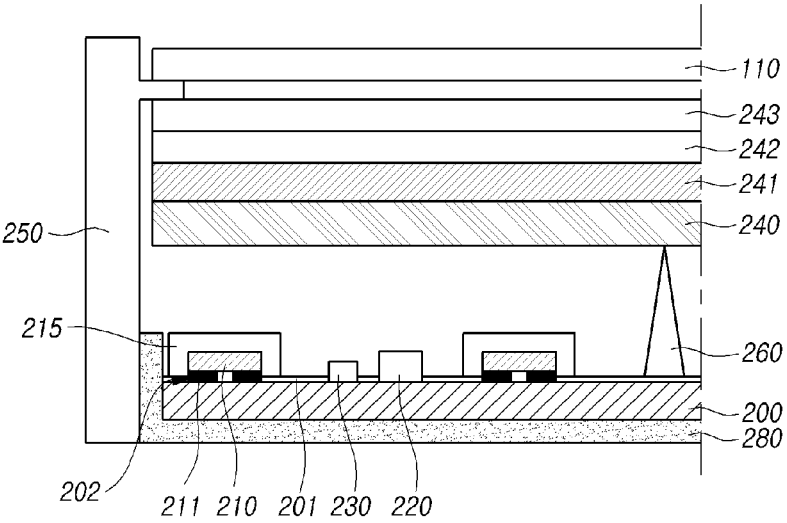
FIG. 2 is a view illustrating a cross-sectional structure of the display device according to the embodiments of the present disclosure.

FIG. 2 is a view illustrating a cross-sectional structure of the display device according to the embodiments of the present disclosure.

Referring to FIG. 2, the display device 100 may include the display panel 110 and the backlight unit which is disposed under the display panel 110 and supplies light to the display panel 110.

The backlight unit may include light sources 210, a first transistor 220, and a second transistor 230 disposed on a substrate 200.

A reflection layer 201 of at least one layer may be disposed on the substrate 200.

The reflection layer 201 may include a material having high reflectivity (for example, $TiO_x$) and may be formed of white ink or in a film form, but the embodiments of the present disclosure are not limited thereto.

The reflection layer 201 may serve to improve the emission efficiency of the backlight unit by reflecting the light emitted from the light sources 210 and converting a path of the light toward the display panel 110.

The reflection layer 201 may include a plurality of holes 202.

The light sources 210 may be disposed in the plurality of holes 202.

The light sources 210, which emit light, may include solder patterns 211 to which a signal for driving the light source 210 is applied.

The light source 210 may be, for example, a light-emitting diode (LED), and may be a mini light-emitting diode (mini LED) or a micro light-emitting diode (μLED). Accordingly, the light source 210 in a chip form may be disposed in a form of being mounted on the printed circuit, and thus may a thickness of the backlight unit may be reduced.

The light sources 210 may emit blue light, and as the blue light is excited through optical members disposed on the light sources 210, white light may be supplied to the display panel 110.

However, the embodiments of the present disclosure are not limited thereto, and in some cases, the light sources 210 may be light sources which emit white light or light sources that emit light in a specific wavelength band other than white light and blue light.

Although not shown in FIG. 2, the solder patterns 211 may be disposed on the substrate 200.

The solder patterns 211 may be disposed in regions corresponding to the holes 202 of the reflection layer 201, and since the reflection layer 201 serves as a wall, a phenomenon in which the solder pattern 211 departs from a region where the light source 210 is disposed and penetrates to another region may be prevented.

That is, since the reflection layer 201 is disposed on the substrate 200 in a region other than the regions where the light sources 210 are disposed, the emission efficiency of the backlight unit may be improved.

Each light source 210 may be surrounded by a light source protection unit 215.

The light source protection unit 215 may be composed of, for example, a resin.

As shown in FIG. 2, the light source protection units 215 may be disposed on the reflection layer 201.

However, a structure of the backlight unit according to the embodiments of the present disclosure is not limited thereto, and the light source protection units 215 may be disposed in the holes 202 of the reflection layer 201.

These light source protection units 215 may protect the light sources 210 and provide a function of diffusing the light emitted from the light sources 210.

A plurality of first transistors 220 and a plurality of second transistors 230 may be disposed on the substrate 200.

Each first transistor 220 and each second transistor 230 may be disposed in the holes 202 of the reflection layer 201.

Here, the first transistor 220 may be a driving transistor which controls driving of the light source 210, and the second transistor 230 may be a switching transistor (or scan transistor) which controls a timing of the first transistor 220.

Since the first and second transistors 220 and 230 are disposed on the substrate 200 on which the light sources 210 are disposed, at least one light-emitting element may be implemented.

For example, the first and second transistors 220 and 230 may drive a plurality of light sources 210 such as at least four light sources 210.

Since the display device according to the embodiments of the present disclosure implements the transistors on the substrate 200 on which the light sources 210 are disposed, an electrode structure of the light source 210 is not limited to a vertical type or a flip type and thus the light source 210 may be more easily formed.

Further, a diffusion plate support member 260 may be disposed on the substrate 200.

The diffusion plate support member 260 may serve to support a diffusion plate 240 disposed on the light sources 210, the first transistor 220, and the second transistor 230.

A color conversion sheet 241 for changing a wavelength band of the light emitted from the light sources 210 may be disposed on the diffusion plate 240.

A plurality of optical sheets may be disposed on the color conversion sheet 241.

The optical sheets may include a prism sheet 242 disposed on the color conversion sheet 241 and a diffusion sheet 243 disposed on the prism sheet 242.

Here, positions at which the diffusion plate 240 and the color conversion sheet 241 are disposed may be interchanged.

The diffusion plate 240 may serve to diffuse the light emitted from the light sources 210.

The color conversion sheet 241 may emit light of a specific wavelength band in response to incident light.

For example, when the light source 210 emits light of a first wavelength band (for example, blue light), the color conversion sheet 241 may emit light of a second wavelength band (for example, green light) and light of a third wavelength band (for example, red light) in response to the incident light. Accordingly, light of a white wavelength band may be supplied to the display panel 110 through the color conversion sheet 241.

In some cases, the color conversion sheet 241 may be disposed only on a partial region on the diffusion plate 240.

A cover bottom 280 surrounding the substrate 200 may be disposed under the substrate 200.

Further, a guide panel 250 may be disposed to correspond to a side surface of each of the substrate 200, the diffusion plate 240, the color conversion sheet 241, and the optical sheets 242 and 243.

A portion of the guide panel 250 may be disposed under the display panel 110 to serve to support the display panel 110.

Figure 3:
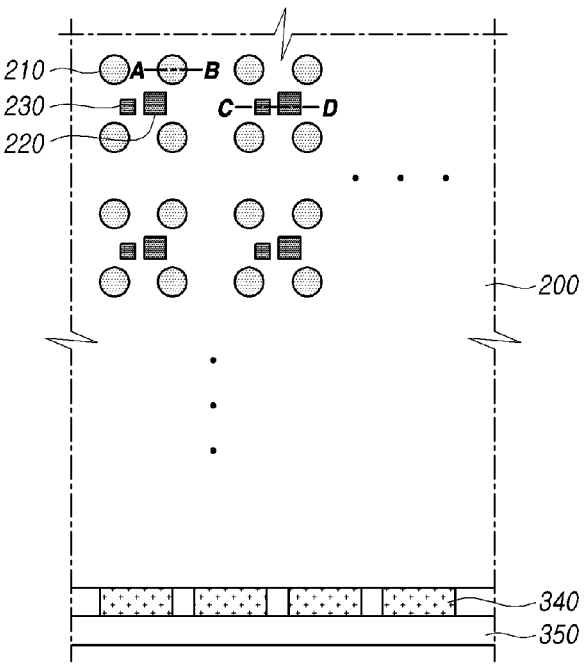
FIG. 3 is a view schematically illustrating a structure of a substrate on which light sources included in a backlight unit of the display device and transistors for driving the light sources are disposed according to the embodiments of the present disclosure.

FIG. 3 is a view schematically illustrating a structure of a substrate on which light sources included in a backlight unit of the display device according to the embodiments of the present disclosure and transistors for driving the light sources are disposed.

Referring to FIG. 3, a plurality of light sources 210, and a first transistor 220 and a second transistor 230, which drive the plurality of light sources 210, may be disposed on the substrate 200.

Here, the substrate 200 may be a glass substrate, but is not limited thereto.

The plurality of light sources 210 disposed on the substrate 200 may be disposed to be spaced apart from each other.

The plurality of light sources 210 may be disposed in a plurality of rows and a plurality of columns.

For example, the plurality of light sources 210 may be disposed in odd rows and odd columns.

Each of the first transistor 220 and the second transistor 230 disposed to be spaced apart from each other may be used to drive the plurality of light sources 210.

For example, one first transistor 220 and one second transistor 230 may be used to drive four light sources 210.

That is, four light sources 210 may be electrically connected to one first transistor 220 and one second transistor 230.

One first transistor 220 and one second transistor 230 may be electrically connected to two light sources 210 disposed in a first row and a first column, and two light sources 210 disposed in the first row and a second column.

Further, one first transistor 220 and one second transistor 230 may be disposed between two light sources 210 disposed in each row.

Specifically, each of one first transistor 220 and one second transistor 230 may disposed between two light sources 210 disposed in each of two rows adjacent to each other, and may disposed between two light sources 210 disposed in each of two columns adjacent to each other.

In other words, each of one first transistor 220 and one second transistor 230 may be disposed so as not to overlap the plurality of light sources 210 disposed at points where two rows and two columns cross each other.

Although not shown in FIG. 3, a plurality of lines which electrically connect the first transistors 220, the second transistors 230, and the plurality of light sources 210 may be disposed on the substrate 200.

Further, a circuit board 350 necessary for driving the first and second transistors 220 and 230 may be disposed on at least one side of the substrate 200.

The circuit board 350 may be connected to the substrate 200 through a plurality of circuit films 340.

Although not shown in the drawings, a plurality of lines electrically connected to the plurality of first transistors 220 and the plurality of second transistors 230 may be disposed on the plurality of circuit films 340.

The first transistors 220 and the second transistors 230 disposed on the substrate 200 may be in a state of being electrically connected to the plurality of lines electrically connected to the circuit board 350.

A structure of the substrate 200 of the backlight unit according to the embodiments of the present disclosure will be reviewed in detail as follows.

Figure 4:
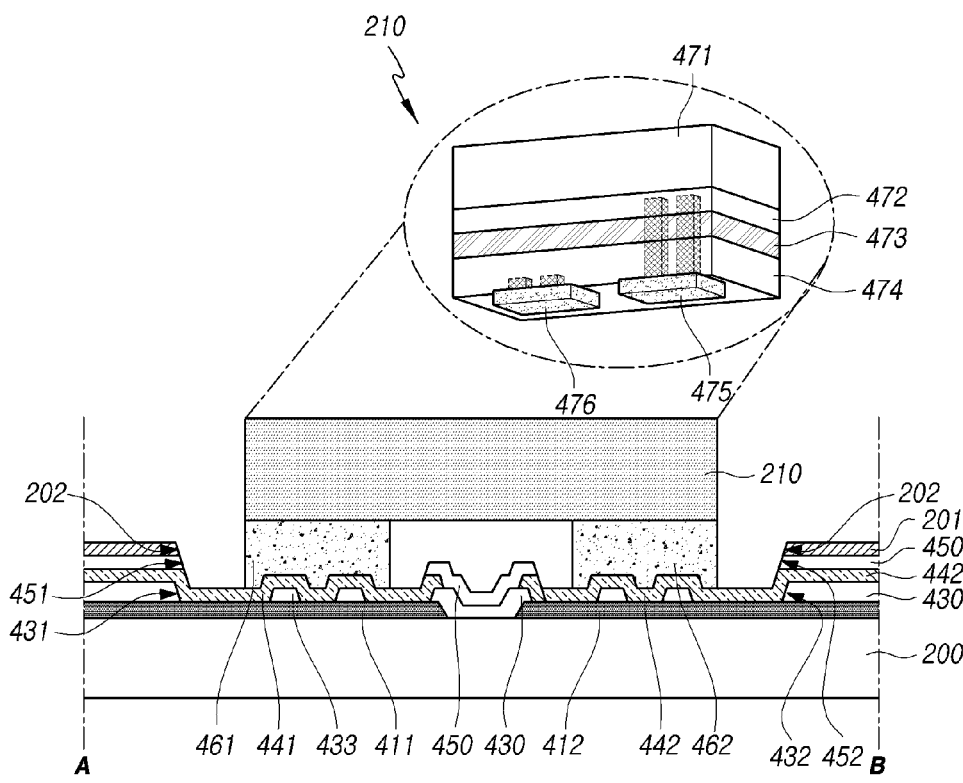
FIG. 4 is a cross-sectional view taken along line A-B of FIG. 3 according to the embodiments of the present disclosure.

FIG. 4 is a cross-sectional view taken along line A-B of FIG. 3 according to one embodiment.

In the following description, contents (configuration, effect, and the like) overlapping the above-described embodiments may be omitted. Further, in the following description, the same reference numerals may be used for reference numerals overlapping those of the above-described embodiments.

Referring to FIG. 4, a first pad electrode 411 and a second pad electrode 412 that are spaced apart from each other may be disposed on the substrate 200 of the backlight unit according to the embodiments of the present disclosure.

The first pad electrode 411 and the second pad electrode 412 may be electrically connected to the circuit board 350 through the circuit film 340 connected to one side of the substrate 200 shown in FIG. 3.

Although not shown in FIG. 4, at least one insulating layer may be disposed between the substrate 200 and the first and second pad electrodes 411 and 412.

At least one insulating layer 430 may be disposed on the first pad electrode 411 and the second pad electrode 412. For example, a first insulating layer 430 may be disposed on the first pad electrode 411 and the second pad electrode 412.

Here, the first insulating layer 430 may include an inorganic insulating material. For example, the first insulating layer 430 may include at least one among silicon nitride (SiN$_x$), silicon oxide (SiO$_x$), and silicon oxynitride (SiON), but the embodiments of the present disclosure are not limited thereto.

The first insulating layer 430 may include a plurality of holes 431 and 432.

The holes 431 and 432 of the first insulating layer 430 may be formed to respectively expose portions of upper surfaces of the first pad electrode 411 and the second pad electrode 412.

A first insulating layer pattern 433 may be disposed on the portion of the upper surface of each of the first and second pad electrodes 411 and 412 exposed by the first insulating layer 430.

When a plurality of first insulating layer patterns 433 are disposed on the portion of the upper surface of each of the first and second pad electrodes 411 and 412, the patterns may be spaced apart from each other.

Further, a third pad electrode 441 and a fourth pad electrode 442 spaced apart from each other may be disposed on the substrate 200 on which the first insulating layer 430 and the first insulating layer pattern 433 are disposed.

In regions corresponding to first and second holes 431 and 432 of the first insulating layer 430, the third pad electrode 441 and the fourth pad electrode 442 may each include a protruding portion that is not formed flat due to the first insulating layer pattern 433.

The third and fourth pad electrodes 441 and 442 may include any one of a metal such as aluminum (Al), gold (Au), silver (Ag), copper (Cu), tungsten (W), molybdenum (Mo), chromium (Cr), tantalum (Ta), titanium (Ti), or the like, and an alloy thereof, but are not limited thereto.

The third pad electrode 441 and the fourth pad electrode 442 may be disposed along the holes 431 and 432 of the first insulating layer 430.

Specifically, the third pad electrode 441 may be disposed on the first pad electrode 411, and the fourth pad electrode 442 may be disposed on the second pad electrode 412.

The third pad electrode 441 may come into contact with the first pad electrode 411 in a region corresponding to the first hole 431 of the first insulating layer 430.

The fourth pad electrode 442 may come into contact with the second pad electrode 412 in a region corresponding to the second hole 432 of the first insulating layer 430.

A second insulating layer 450 including one or more layers may be disposed on portions of upper surfaces of the third and fourth pad electrodes 441 and 442.

The second insulating layer 450 may include an inorganic insulating material. For example, the second insulating layer 450 may include at least one among silicon nitride (SiN$_x$), silicon oxide (SiO$_x$), and silicon oxynitride (SiON), but the embodiments of the present disclosure are not limited thereto.

The second insulating layer 450 may include one or more holes 451 and 452.

The holes 451 and 452 of the second insulating layer 450 may be formed to respectively expose portions of upper surfaces of the third pad electrode 441 and the fourth pad electrode 442.

Specifically, a third hole 451 of the second insulating layer 450 may expose the upper surface of the third pad electrode 441 in a region where the third pad electrode 441 comes into contact with the first pad electrode 411.

Further, a fourth hole 452 of the second insulating layer 450 may expose the upper surface of the fourth pad electrode 442 in a region where the fourth pad electrode 442 comes into contact with the second pad electrode 412.

A reflection layer 201 may be disposed on at least a portion of an upper surface of the second insulating layer 450.

The reflection layer 201 may include a hole 202, and the hole 202 of the reflection layer 201 may overlap the first to fourth holes 431, 432, 451, and 452 of the first and second insulating layers 430 and 450.

In a region where the first hole 431 and the third hole 451 of the first and second insulating layers 430 and 450 and the hole 202 of the reflection layer 201 overlap each other, a first solder pattern 461 may be disposed on the third pad electrode 441.

Further, in a region where the second hole 432 and the fourth hole 452 of the first and second insulating layers 430 and 450 and the hole 202 of the reflection layer 201 overlap each other, a second solder pattern 462 may be disposed on the fourth pad electrode 442.

The first and second solder patterns 461 and 462 may come into contact with and be electrically connected to the third and fourth pad electrodes 441 and 442.

The first and second solder patterns 461 and 462 may respectively come into contact with the protruding portions of the third and fourth pad electrodes 441 and 442, and accordingly, an adhesive force between the first solder pattern 461 and the third pad electrode 441 may be improved, and an adhesive force between the second solder pattern 462 and the fourth pad electrode 442 may be improved.

The light source 210 may be disposed on the first solder pattern 461 and the second solder pattern 462.

As shown in FIG. 4, the light source 210 includes a light source substrate 471, an n-type semiconductor layer 472, an active layer 473, a p-type semiconductor layer 474, a first electrode 475, and a second electrode 476.

The light source substrate 471 may be formed of at least one among Al$_2$O$_3$, SiC, Si, GaAs, GaN, ZnO, GaP, InP, and Ge.

The n-type semiconductor layer 472 may be a semiconductor layer doped with a first conductivity type dopant. The n-type semiconductor layer 472 may be formed of at least one among GaN, InN, AlN, InGaN, AlGaN, and InAlGaN, and the first conductivity type dopant of the n-type semiconductor layer may include one or more among Si, Ge, Sn, Se, and Te which are n-type dopants.

The active layer 473 may be formed in a single quantum well structure or a multi quantum well (MQW) structure. That is, the active layer 473 may be formed of at least one among GaN, InN, AlN, InGaN, AlGaN, and InAlGaN using a group III-V compound semiconductor material.

For example, the active layer 473 may have a structure in which InGaN well layers and GaN barrier layers are alternately formed. The active layer 473 may generate light while carriers supplied from the n-type semiconductor layer 472 and carriers supplied from the p-type semiconductor layer 474 recombine.

The carriers supplied from the n-type semiconductor layer 472 may be electrons, and the carriers supplied from the p-type semiconductor layer 474 may be holes.

The p-type semiconductor layer 474 includes a semiconductor layer doped with a second conductivity type dopant, and may be formed as a single layer or a multilayer.

The p-type semiconductor layer 474 may be formed of at least one among GaN, InN, AlN, InGaN, AlGaN, and InAlGaN, and the second conductivity type dopant may include at least one among Mg, Zn, Ca, Sr, and Ba, which are p-type dopants.

The first electrode 475 of the light source 210 may be electrically connected to the n-type semiconductor layer 472. The first electrode 475 may be an n-type electrode.

Further, the second electrode 476 of the light source 210 may be electrically connected to the p-type semiconductor layer 474. The second electrode 476 may be a p-type electrode.

The first electrode 475 and the second electrode 476 of the light source 210 may be connected to a bonding pad 212.

As described in FIG. 3, the light source 210 having the above-described structure may be driven through the first transistor and the second transistor.

Structures of the first and second transistors will be reviewed as follows.

Figure 5:
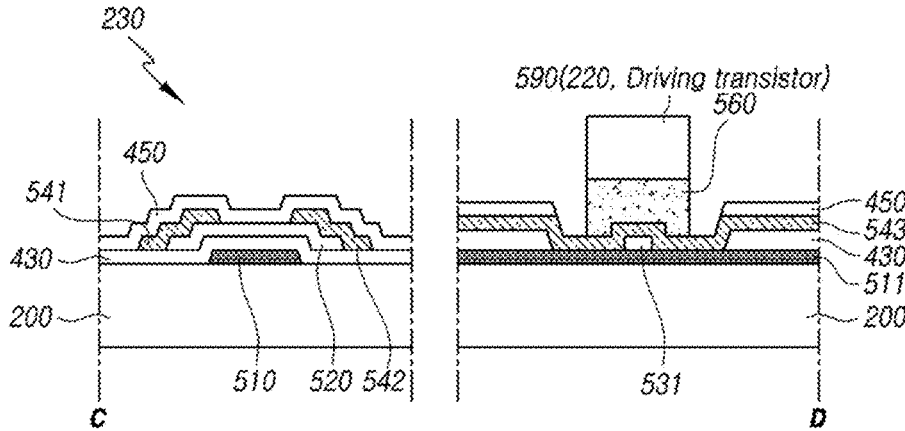
FIG. 5 is a cross-sectional view taken along line C-D of FIG. 3 according to the embodiments of the present disclosure.

FIG. 5 is a cross-sectional view taken along line C-D of FIG. 3 according to one embodiment.

In the following description, contents (configuration, effect, and the like) overlapping the above-described embodiments may be omitted. Further, in the following description, the same reference numerals may be used for reference numerals overlapping those of the above-described embodiments.

At least one first transistor 220 and at least one second transistor 230 may be disposed on the substrate 200.

The first transistor 220 may correspond to a semiconductor chip 590.

A first semiconductor chip pad electrode 511 may be disposed on the substrate 200, and the first insulating layer 430 may be disposed on the first semiconductor chip pad electrode 511.

The first semiconductor chip pad electrode 511 may be disposed on the same layer as the first and second pad electrodes 411 and 412 of FIG. 4 and may include the same material.

Further, the first insulating layer 430 may include a hole which exposes a portion of an upper surface of the first semiconductor chip pad electrode 511.

At least one first insulating layer pattern 531 may be disposed on the portion of the upper surface of the first semiconductor chip pad electrode 511 in a region corresponding to the hole of the first insulating layer 430.

A second semiconductor chip pad electrode 543 may be disposed on the first insulating layer 430 and the first insulating layer pattern 531.

In the region corresponding to the hole of the first insulating layer 430, the second semiconductor chip pad electrode 543 may include at least one protruding portion due to the first insulating layer pattern 531.

In other words, since the second semiconductor chip pad electrode 543 is disposed on the first insulating layer pattern 531, a morphology of the second semiconductor chip pad electrode 543 may be formed along the first insulating layer pattern 531.

The second semiconductor chip pad electrode 543 may be disposed on the same layer as the third pad electrode and fourth pad electrodes 441 and 442 of FIG. 4 and may include the same material.

The second semiconductor chip pad electrode 543 may be disposed along the hole of the first insulating layer 430. The second semiconductor chip pad electrode 543 may come into contact with the first semiconductor chip pad electrode 511 in a region overlapping the hole of the first insulating layer 430.

The second insulating layer 450 may be disposed on a portion of an upper surface of the second semiconductor chip pad electrode 543.

The second insulating layer 450 may include a hole overlapping the hole of the first insulating layer 430.

The hole of the second insulating layer 450 may expose the upper surface of the second semiconductor chip pad electrode 543 in a region where the second semiconductor chip pad electrode 543 and the first semiconductor chip pad electrode 511 come into contact with each other.

Although not shown in the drawings, a reflection layer may be further disposed on the second insulating layer 450.

A solder pattern 560 and the semiconductor chip 590 may be disposed on the second semiconductor chip pad electrode 543 in the region overlapping the hole of each of the first and second insulating layers 430 and 450.

Although a structure in which one solder pattern 560 is disposed under one semiconductor chip 590 is shown in FIG. 5, a plurality of solder patterns 560 may be disposed under one semiconductor chip 590.

The semiconductor chip 590 may be a metal-oxide-semiconductor field-effect transistor (MOSFET). For example, the semiconductor chip 590 may be an NMOSFET or a PMOSFET.

The second transistor 230 may include a gate electrode 510, an active layer 520, a source electrode 541, and a drain electrode 542.

Specifically, the gate electrode 510 may be disposed on the substrate 200.

The gate electrode 510 may be disposed on the same layer as the first semiconductor chip pad electrode 511 and may include the same material.

The first insulating layer 430 may be disposed on the gate electrode 510.

The active layer 520 may be disposed on the first insulating layer 430. Here, the active layer 520 may be formed of an a-Si semiconductor.

The source electrode 541 and the drain electrode 542 spaced apart from each other may be disposed on the active layer 520 and the first insulating layer 430.

Each of the source electrode 541 and the drain electrode 542 may be disposed on the same layer as the second semiconductor chip pad electrode 543 and may be formed of the same material.

In FIG. 5, a structure in which 541 is a source electrode and 542 is a drain electrode is mainly described, but 541 may be the drain electrode and 542 may be the source electrode.

One of the source electrode 541 and the drain electrode 542 may be electrically connected to the third pad electrode 441 or the fourth pad electrode 442 of FIG. 4.

The second insulating layer 450 may be disposed on the source electrode 541 and the drain electrode 542.

As mentioned above, the plurality of light sources (for example, four light sources) may be electrically connected to the first transistor 220 and the second transistor 230.

For example, the third and fourth pad electrodes 441 and 442 disposed under the first and second solder patterns 461 and 462 may be electrically connected to the first and second transistors 220 and 230.

This will be reviewed with reference to FIG. 6 as follows.

Figure 6:
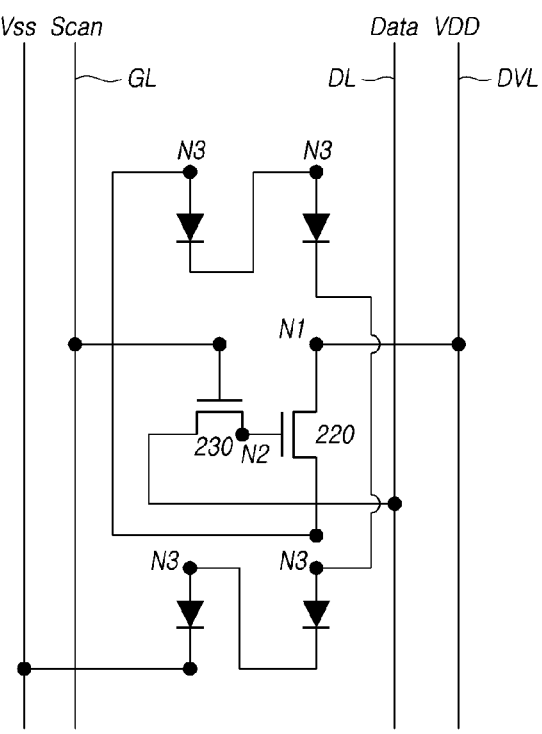
FIG. 6 is a view illustrating an example of a circuit structure of the backlight unit included in the display device according to the embodiments of the present disclosure.

FIG. 6 is a view illustrating an example of a circuit structure of the backlight unit included in the display device according to the embodiments of the present disclosure.

Referring to FIG. 6, the backlight unit included in the display device according to the embodiments of the present disclosure may include light sources, and a first transistor 220 and a second transistor 230 for driving the light sources.

The first transistor 220 controls driving of the light sources and may have a first node N1, a second node N2, and a third node N3.

The first node N1 of the first transistor 220 is electrically connected to a driving voltage line DVL to which a driving voltage VDD is applied, and may be a drain node or a source node.

The second node N2 of the first transistor 220 is electrically connected to the second transistor 230 and a storage capacitor (not shown), and may be a gate node.

The third node N3 of the first transistor 220 is electrically connected to the light source and may be a source node or a drain node.

Here, the first transistor 220 may have a plurality of third nodes N3. For example, the first transistor 220 may have four third nodes N3.

The second transistor 230 operates according to a scan signal applied through a gate line GL, and controls an operation timing of the first transistor 220.

The storage capacitor (not shown) may maintain a data voltage Vdata applied to the second node N2 for one frame.

The light source may have an anode and a cathode , the anode may be electrically connected to the third node N3 of the first transistor 220, and a base voltage Vss may be applied to the cathode.

Although an nMOS type is described as an example of this structure, a case of a pMOS type is also included.

Meanwhile, although a structure in which the first transistor 220 and the second transistor 230 drive four light sources is mainly described in FIGS. 4 and 6, the embodiments of the present disclosure are not limited thereto.

For example, three transistors may drive multiple light sources.

This will be reviewed with reference to FIGS. 7 to 9 as follows.

Figure 7:
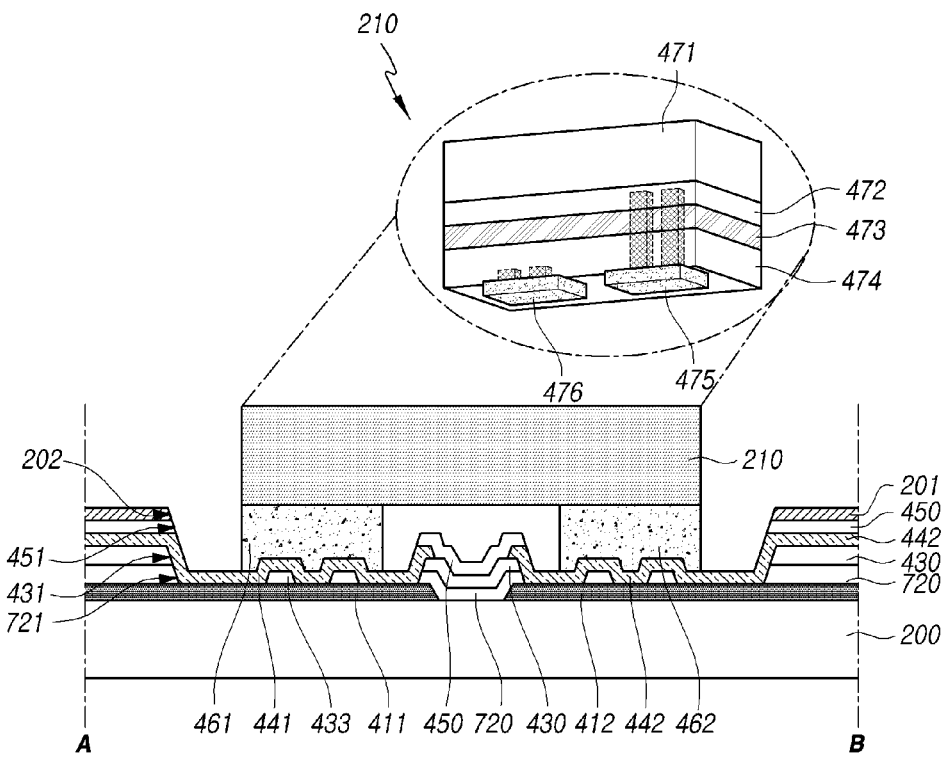
FIG. 7 is a view illustrating a structure of a cross-section taken along line A-B of FIG. 3 according to another embodiment of the present disclosure.

FIG. 7 is a view illustrating another embodiment of a structure of a cross-section taken along line A-B of FIG. 3.

In the following description, contents (configuration, effect, and the like) overlapping the above-described embodiments may be omitted. Further, in the following description, the same reference numerals may be used for reference numerals overlapping those of the above-described embodiments.

Referring to FIG. 7, a first pad electrode 411 and a second pad electrode 412 spaced apart from each other may be disposed on the substrate 200 of the backlight unit according to the embodiments of the present disclosure.

The first pad electrode 411 and the second pad electrode 412 may be electrically connected to the circuit board 350 through the circuit film 340 connected to one side of the substrate 200 shown in FIG. 3.

At least one insulating layer 720 and at least one insulating layer 430 may be disposed on the first pad electrode 411 and the second pad electrode 412. For example, a third insulating layer 720 and a first insulating layer 430 disposed on the third insulating layer 720 may be disposed on the first pad electrode 411 and the second pad electrode 412.

Here, the third insulating layer 720 and the first insulating layer 430 may include an inorganic insulating material. For example, the third insulating layer 720 and the first insulating layer 430 may include at least one among silicon nitride $(SiN_x)$, silicon oxide $(SiO_x)$, and silicon oxynitride (SiON), but the embodiments of the present disclosure are not limited thereto.

The first and third insulating layers 430 and 720 may respectively include at least one hole 431 and at least hole 721.

The holes 431 and 721 of the first and third insulating layers 430 and 720 may be formed to respectively expose portions of upper surfaces of the first pad electrode 411 and the second pad electrode 412.

A first insulating layer pattern 433 may be disposed on the portion of the upper surface of each of the first and second pad electrodes 411 and 412 exposed by the first and third insulating layers 430 and 720.

At least one pair of pad electrodes 441 and 442 may be disposed on the substrate 200 on which the first and third insulating layers 430 and 720 are disposed.

For example, as shown in FIG. 7, a third pad electrode 441 and a fourth pad electrode 442 spaced apart from each other may be disposed on the substrate 200.

The third and fourth pad electrodes 441 and 442 may include any one of a metal such as aluminum (Al), gold (Au), silver (Ag), copper (Cu), tungsten (W), molybdenum (Mo), chromium (Cr), tantalum (Ta), titanium (Ti), or the like, and an alloy thereof, but are not limited thereto.

The third pad electrode 441 and the fourth pad electrode 442 may be disposed along the holes 721 and 431 of the third and first insulating layers 720 and 430. The third pad electrode 441 and the fourth pad electrode 442 may respectively come into contact with the first and second pad electrodes 411 and 412 in regions overlapping the holes 721 and 431 of the third and first insulating layers 720 and 430.

A second insulating layer 450 including one or more layers may be disposed on the portions of the upper surfaces of the third and fourth pad electrodes 441 and 442.

The second insulating layer 450 may include at least one hole 451.

The hole 451 of the second insulating layer 450 may be formed to expose a portion of an upper surface of each of the third and fourth pad electrodes 441 and 442.

Specifically, the hole 451 of the second insulating layer 450 may expose the upper surfaces of the third and fourth pad electrodes 441 and 442 in regions where the third and fourth pad electrodes 441 and 442 respectively come into contact with the first and second pad electrodes 411 and 412.

A reflection layer 201 may be disposed on at least a portion of the upper surface of the second insulating layer 450.

The reflection layer 201 may include a hole 202, and the hole 202 of the reflection layer 201 may overlap the holes 431, 451, and 721 of the first to third insulating layers 430, 450, and 720.

A first solder pattern 461 may be disposed on the third pad electrode 441, and a second solder pattern 462 may be disposed on the fourth pad electrode 442.

The first and second solder patterns 461 and 462 may come into contact with and be electrically connected to the third and fourth pad electrodes 441 and 442, respectively.

A light source 210 may be disposed on the first solder pattern 461 and the second solder pattern 462.

The structure of the light source 210 may correspond to the structure shown in FIG. 4.

Meanwhile, at least three transistors may be used for driving a plurality of light sources 210 having the structure of FIG. 7.

This will be reviewed with reference to FIG. 8 as follows.

Figure 8:
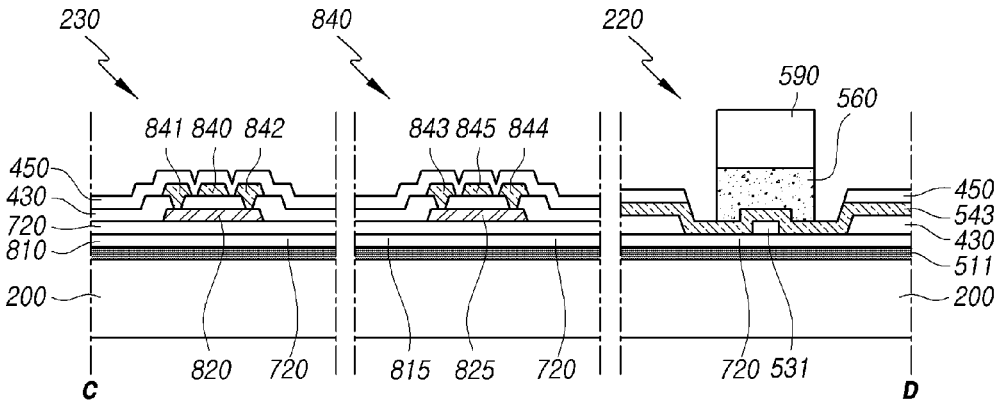
FIG. 8 is a view illustrating structures of a first transistor, a second transistor, and a third transistor which drive four light sources according to the embodiments of the present disclosure.

FIG. 8 is a view illustrating structures of a first transistor, a second transistor, and a third transistor which drive four light sources according to one embodiment.

In the following description, contents (configuration, effect, and the like) overlapping the above-described embodiments may be omitted. Further, in the following description, the same reference numerals may be used for reference numerals overlapping those of the above-described embodiments.

Referring to FIG. 8, the substrate 200 may include at least one first transistor 220, at least one second transistor 230, and at least one third transistor 840 disposed thereon.

Here, the first transistor 220 may be a driving transistor, the second transistor 230 may be a scan transistor (or switching transistor), and the third transistor 840 may be a sense transistor.

The structure of the first transistor 220 is the same as the structure of the first transistor 220 described with reference to FIG. 5 except that a third insulating layer 720 is additionally disposed between a first semiconductor chip pad electrode 511 and a first insulating layer 430.

The structure of the second transistor 230 and the structure of the third transistor 840 may correspond to each other.

Specifically, the second transistor 230 and the third transistor 840 may respectively include light blocking layers 810 and 815 disposed on the substrate 200.

The light blocking layers 810 and 815 may be disposed on the same layer as the first and second pad electrodes 411 and 412 of FIG. 7 and the first semiconductor chip pad electrode 511 of FIG. 8 and may be formed of the same material.

The third insulating layer 720 may be disposed on the light blocking layers 810 and 815.

Active layers 820 and 825 may be disposed on the third insulating layer 720. Each of the active layers 820 and 825 of the second and third transistors 230 and 840 may be formed as an oxide semiconductor layer.

The first insulating layer 430 may be disposed on the substrate 200 on which the active layers 820 and 825 are disposed.

Gate electrodes 840 and 845, source electrodes 841 and 843, and drain electrodes 842 and 844 may be disposed on the first insulating layer 430.

Here, the gate electrodes 840 and 845, the source electrodes 841 and 843, and the drain electrodes 842 and 844 may be disposed on the same layer as the third and fourth pad electrodes 441 and 442 of FIG. 7 and the second semiconductor chip pad electrode 543 of FIG. 8 and may be formed of the same material.

A second insulating layer 450 may be disposed on the gate electrodes 840 and 845, the source electrodes 841 and 843, and the drain electrodes 842 and 844.

Like the above, the backlight unit according to the embodiments of the present disclosure may include transistors having various structures to drive a plurality of light sources.

The plurality of light sources (for example, four light sources) may be electrically connected to the first transistor 220, the second transistor 230, and the third transistor 840.

This will be reviewed with reference to FIG. 9 as follows.

Figure 9:
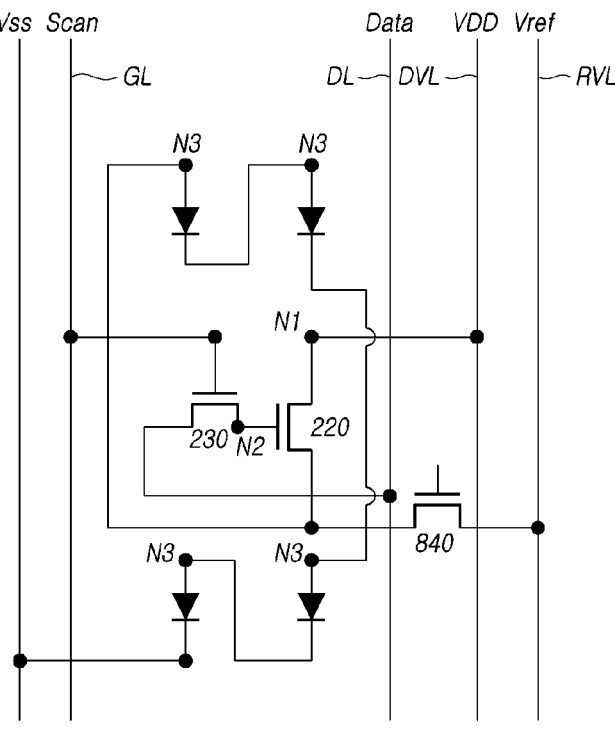
FIG. 9 is a view illustrating an example of the circuit structure of the backlight unit having a structure of FIGS. 7 and 8 according to the embodiments of the present disclosure.

FIG. 9 is a view illustrating an example of the circuit structure of the backlight unit having the structure of FIGS. 7 and 8 according to one embodiment.

In the following description, contents (configuration, effect, and the like) overlapping the above-described embodiments may be omitted. Further, in the following description, the same reference numerals may be used for reference numerals overlapping those of the above-described embodiments.

Referring to FIG. 9, the backlight unit included in the display device according to the embodiments of the present disclosure may include light sources and a first transistor 220, a second transistor 230, and a third transistor 840 for driving the light sources.

The first transistor 220 may have a plurality of third nodes N3. For example, the first transistor 220 may have four third nodes N3.

The second transistor 230 operates according to a scan signal applied through a gate line GL, and controls an operation timing of the first transistor 220.

In the third transistor 840, since the first transistor 220, which is a driving transistor, is electrically connected between a second node N2 and a reference voltage line RVL to receive a signal to a gate node, on/off may be controlled.

One of a drain node and a source node of the third transistor 840 may be electrically connected to the reference voltage line RVL, and the other of the source node and the drain node of the third transistor 840 may be electrically connected to the second node N2 of the first transistor 220.

The third transistor 840 may be, for example, turned on in a display driving section, and turned on in a sensing driving section for sensing a characteristic value of the first transistor 220 or a characteristic value of the light source.

The third transistor 840 may be turned on by a signal according to a corresponding driving timing (for example, a display driving timing or an initialization timing in a sensing driving section) to transmit a reference voltage Vref supplied to the reference voltage line RVL to the second node N2 of the first transistor 220.

Further, the third transistor 840 may be turned on by a signal according to a corresponding driving timing (for example, a sampling timing in the sensing driving section) to transmit a voltage of the second node N2 of the first transistor 220 to the reference voltage line RVL.

Meanwhile, the number of light sources 210 attached onto the substrate 200 is increasing according to miniaturization of the light sources 210 for improving image quality, and accordingly, the number of driving circuits which drive the light sources 210 also increases in proportion to the number of light sources 210.

Since the structure of the substrate 200 becomes very complicated as the number of driving circuits increases, a technology for bundling and driving portions of the light sources 210 through an active matrix (AM) driving method has been devised. In this case, an active matrix integrated circuit (AMIC) was used, but there was a problem in that costs increased.

Accordingly, the backlight unit according to the embodiments of the present disclosure may use a structure in which a plurality of transistors are disposed on the substrate 200 to drive the plurality of light sources 210, and thus may have an effect in that sizes of components which drive the light sources 210 can be reduced while reducing costs even when the number of light sources 210 increases.

Specifically, when the substrate 200 is a glass substrate, since a small transistor capable of driving the light source 210 may be integrated (formed through a deposition process), this may be advantageous for providing a large backlight unit.

In addition, the number of lines connected to the light sources 210 may increase as the number of light sources 210 increases, and when the glass substrate is used, since the line may also be formed through the deposition process, and thus may have a reduced width and may also have a reduced thickness, there is an effect in that the number of lines can be increased without increasing the sheet resistance of the lines.

As described above, the light sources 210 may be disposed on the third pad electrode 441 and the fourth pad electrode 442 disposed on the substrate 200.

However, defects may occur in a process of attaching the light sources 210 to the third and fourth pad electrodes 441 and 442, and in this case, the solder pattern 211 formed on portions of the light sources 210 attached to the third and fourth pad electrodes 441 and 442 may be detached and reattached onto repair patterns.

The repair patterns may be disposed on the same layer as the third and fourth pad electrodes 441 and 442, and may be formed of the same material. Further, the repair patterns may be disposed in parallel with the third and fourth pad electrodes 441 and 442.

Specifically, the repair pattern may be disposed between the third and fourth pad electrodes 441 and 442 and other third and fourth pad electrodes 441 and 442 adjacent thereto.

In other words, through repair, the reattached light sources 210 may be disposed in rows or columns other than the rows or columns in which the first and second pad electrodes 441 and 442 are disposed.

Accordingly, when the repaired light sources 210 operate, a darkening phenomenon may occur in regions corresponding to the third and fourth pad electrodes 441 and 442 which are attached before repair.

Accordingly, the backlight unit according to the embodiments of the present disclosure may include the third and fourth pad electrodes capable of preventing the darkening phenomenon in specific portions even when the light sources 210 are repaired.

This will be reviewed with reference to FIGS. 10 and 11 as follows.

Figure 10:
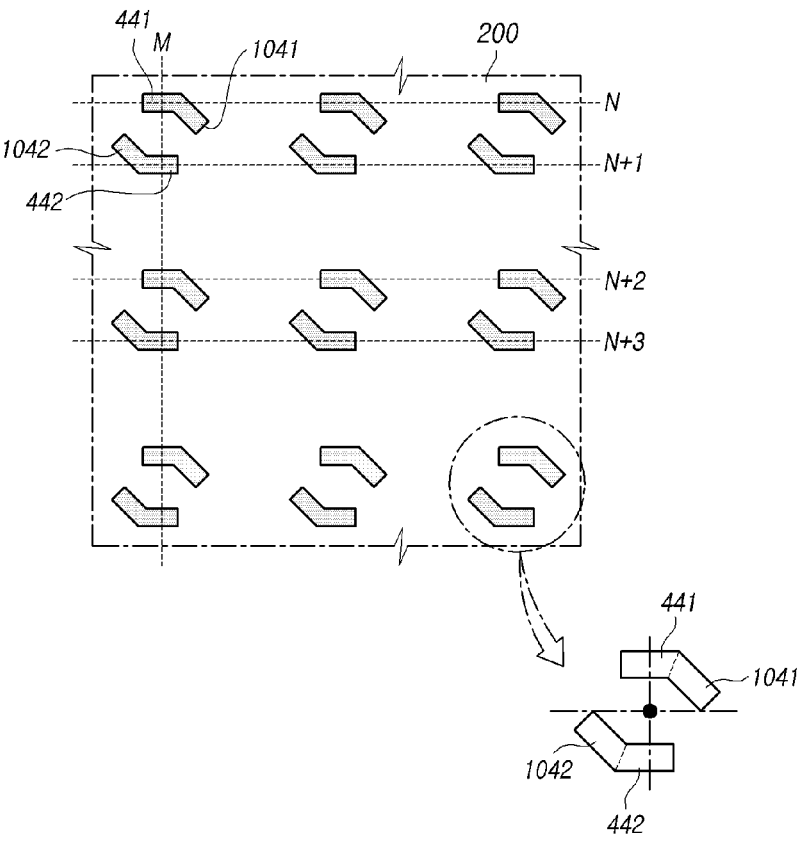
FIG. 10 is a view illustrating positions of a third electrode pattern, a fourth pad electrode, a first repair pattern, and a second repair pattern disposed in the backlight unit according to the embodiments of the present disclosure.

FIG. 10 is a view illustrating positions of a third electrode pattern, a fourth pad electrode, a first repair pattern, and a second repair pattern disposed in the backlight unit according to the embodiments of the present disclosure.

Figure 11:
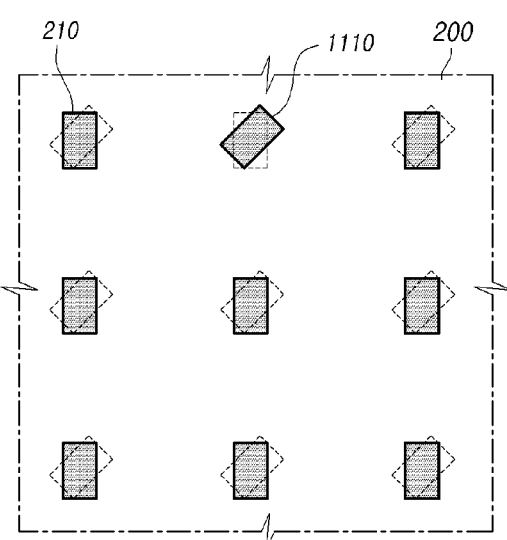
FIG. 11 is a view illustrating light sources disposed on first and second solder patterns, and light sources disposed on first and second repair patterns according to the embodiments of the present disclosure.

FIG. 11 is a view illustrating light sources disposed on first and second solder patterns, and light sources disposed on first and second repair patterns In the following description, contents (configuration, effect, and the like) overlapping the above-described embodiments may be omitted. Further, in the following description, the same reference numerals may be used for reference numerals overlapping those of the above-described embodiments.

First, referring to FIG. 10, a third pad electrode 441, a fourth pad electrode 442, a first repair pattern 1041, and a second repair pattern 1042 may be disposed on the substrate 200.

A plurality of third pad electrodes 441 and a plurality of fourth pad electrodes 442 may be disposed to be spaced apart from each other, and may be disposed in a plurality of columns and a plurality of rows.

Specifically, the plurality of third pad electrodes 441 may be disposed in an Nth row to be spaced apart from each other.

Further, the plurality of fourth pad electrodes 442 may be disposed to be spaced apart from each other, and may be disposed in an N+lth row. In addition, the plurality of fourth pad electrodes 442 may be disposed to be spaced apart from the plurality of third pad electrodes 441.

For example, when N is an odd number, the plurality of third pad electrodes 441 may be disposed in odd rows, and the plurality of fourth pad electrodes 442 may be disposed in even rows.

Further, one third pad electrode 441 and one fourth pad electrode 442 may form a pair of pad electrodes, and as shown in FIG. 11, the light sources 210 may be attached onto the pair of pad electrodes through solder patterns thereunder.

In other words, one light source 210 may be attached to one third pad electrode 441 disposed in the Nth row and an Mth column and one fourth pad electrode 442 disposed in the N+1th row and the Mth column.

The first repair pattern 1041 may be disposed on the substrate 200 to be adjacent to the third pad electrode 441.

Further, the second repair pattern 1042 may be disposed on the substrate 200 to be adjacent to the fourth pad electrode 442.

As shown in FIG. 11, one light source 1110 disposed on a pair of repair patterns 1041 and 1042 may be disposed to be inclined at a predetermined angle with respect to a row direction.

For example, one light source 1110 (hereinafter, referred to as a repaired light source) disposed on the pair of repair patterns 1041 and 1042 may be disposed to be inclined at an angle greater than 0° and smaller than or equal to 90° with respect to the row direction (in this case, it is assumed that a state in which the third and fourth pad electrodes are arranged is a state in which the third and fourth pad electrodes are disposed to have an angle of 0° in the row direction).

For example, when it is assumed that long axes of the light sources 210 before repair are arranged in the row direction, the long axes of the repaired light sources 1110 may be disposed to be inclined at an angle greater than 0° and smaller than or equal to 90° with respect to the row direction.

In other words, an extending direction of the long axes of the light sources 210 disposed on the pair of pad electrodes 441 and 442 and an extending direction of the long axes of the repaired light sources 1110 disposed on the first and second repair patterns 1041 and 1042 may be different from each other.

The pair of pad electrodes (441 and 442, the third and fourth pad electrodes) may be symmetrical with respect to a point located at a center of a region between the pad electrodes. In other words, the pair of pad electrodes 441 and 442 may be point-symmetrically located.

Further, the pair of repair patterns 1041 and 1042 may be symmetrical with respect to a virtual point located in a region between the repair patterns. In other words, the pair of repair patterns 1041 and 1042 may be point-symmetrically located.

Further, a reference point at which the pair of pad electrodes 441 and 442 are point-symmetrically located and a reference point at which the pair of repair patterns 1041 and 1042 are point-symmetrically located may be the same.

Disposition relationships of the third and fourth pad electrodes 441 and 442 and the first and second repair patterns 1041 and 1042 according to the embodiments of the present disclosure are not limited to the structure of FIG. 10.

Figure 12:
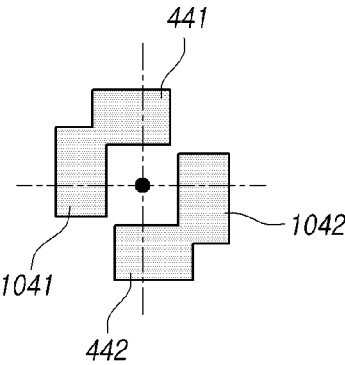
FIGS. 12 to 14 are views illustrating various disposition relationships of the first and second solder patterns and the first and second repair patterns according to the embodiments of the present disclosure.
Figure 13:
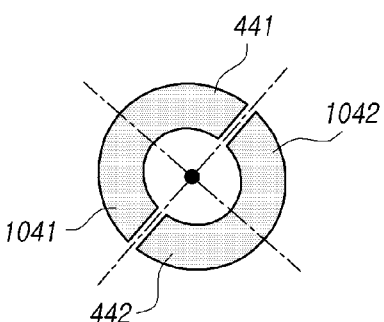
Figure 14:
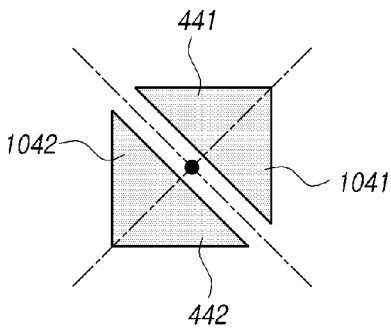

FIGS. 12 to 14 are views illustrating various disposition relationships of the first and second solder patterns and the first and second repair patterns.

First, referring to FIG. 12, one repaired light source 1110 disposed on the pair of repair patterns 1041 and 1042 may be disposed to be inclined at an angle of 90° with respect to the row direction (in this case, it is assumed that a state in which the third and fourth pad electrodes are arranged is a state in which the third and fourth pad electrodes are disposed to have an angle of 0° in the row direction).

Meanwhile, in FIGS. 10 and 12, although a case in which the third and fourth pad electrodes 441 and 442 and the first and second repair patterns 1041 and 1042 each have a quadrangular shape in a plan view is shown, shapes of the third and fourth pad electrodes 441 and 442 and the first and second repair patterns 1041 and 1042 according to the embodiments of the present disclosure are not limited thereto.

As shown in FIG. 13, the third and fourth pad electrodes 441 and 442 and the first and second repair patterns 1041 and 1042 may each have a curved surface shape in a plan view.

Further, as shown in FIG. 14, the third and fourth pad electrodes 441 and 442 and the first and second repair patterns 1041 and 1042 may each have a triangular shape in a plan view.

In other words, the third and fourth pad electrodes 441 and 442 and the first and second repair patterns 1041 and 1042 may each be formed in various shapes such as a polygonal shape, a curved surface shape, a circular shape, an oval shape, and the like in a plan view.

In this case, the reference point at which the pair of third and fourth pad electrodes 441 and 442 are point-symmetrically located and the reference point at which the pair of repair patterns 1041 and 1042 are point-symmetrically located may be the same.

Optical characteristics of a backlight unit having the repair patterns according to the embodiments of the present disclosure and a backlight unit according to a comparative example are compared as follows.

Figure 15:
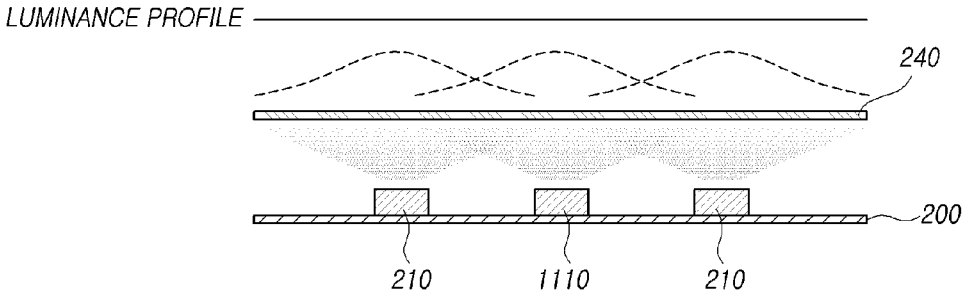
FIG. 15 is a view illustrating the optical characteristics of the backlight unit including structures of the third and fourth pad electrodes and the first and second repair patterns shown in FIG. 10 according to the embodiments of the present disclosure.

FIG. 15 is a view illustrating the optical characteristics of the backlight unit including structures of the third and fourth pad electrodes and the first and second repair patterns shown in FIG. 10 according to one embodiment.

Figure 16:
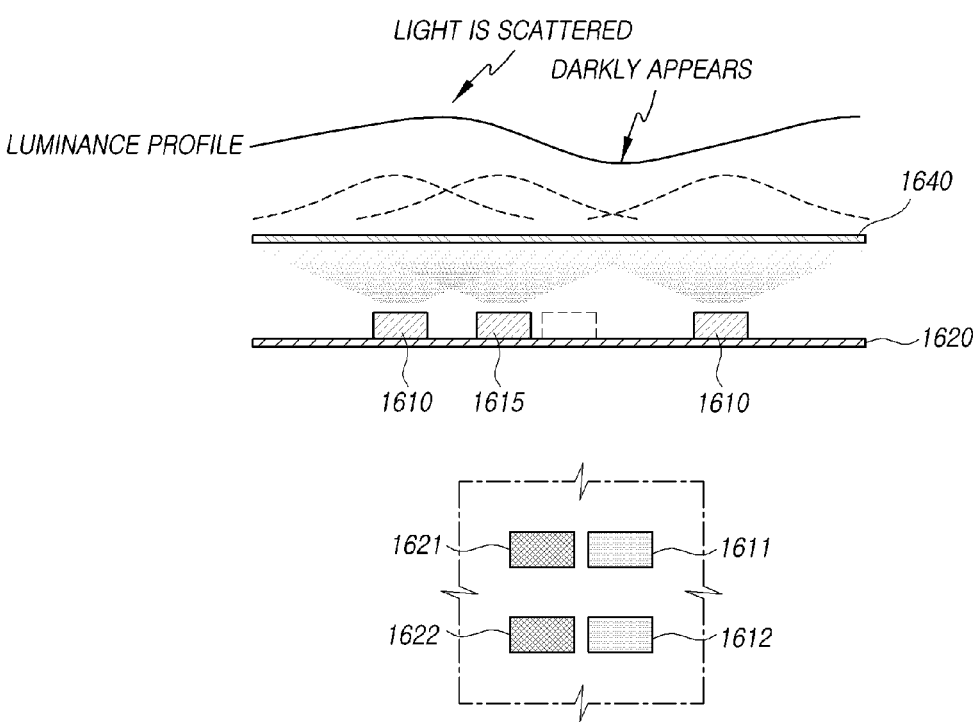
FIG. 16 is a view illustrating the optical characteristics of a backlight unit according to a comparative example.

FIG. 16 is a view illustrating the optical characteristics of the backlight unit according to the comparative example.

Light sources 1610 and repaired light sources 1615 may be disposed on a substrate 1620 of the backlight unit of FIG. 16.

Further, repair patterns to which the repaired light sources 1615 are attached may be disposed in parallel in a row direction of solder patterns to which the light sources 1610 are attached. In other words, the repair pattern may have a form in which the solder pattern is moved a predetermined distance only in the row direction.

First, referring to FIG. 15, the light sources 210 and the repaired light sources 1110 may be disposed on the substrate 200 of the backlight unit according to the embodiment of the present disclosure.

When the light sources 210 and the repaired light sources 1110 are turned on, light may be emitted to pass through a diffusion plate 240.

As shown in FIG. 15, it can be seen that a luminance profile is constant regardless of the light sources 210 and the repaired light sources 1110.

Referring to FIG. 16, when the light sources 1610 and the repaired light sources 1615 of the backlight unit according to the comparative example are turned on, light may be emitted to pass through a diffusion plate 1640.

In this case, as shown in FIG. 16, due to a change of central axes of repaired light sources 1615, a phenomenon in which light is scattered occurs in a partial region (brighter than other regions), and a phenomenon in which other partial regions darkly appear occurs.

That is, since the repaired light sources 1615 are disposed to be biased in a predetermined direction, the optical characteristics of the backlight unit may deteriorate.

However, the repaired light sources 1110 (the light sources disposed on the first and second repair patterns) of the backlight unit according to the embodiments of the present disclosure may be disposed to have the same central axes as the light sources 210 before being repaired (the light sources disposed on the third and fourth pad electrodes).

Accordingly, even when the repair of the light sources 210 proceeds, a phenomenon in which light is biased to the partial region and thus the partial region appears bright and other regions appear dark may be prevented.

Further, since the pair of repair patterns 1041 and 1042 are disposed adjacent to the pair of pad electrodes 441 and 442, a backlight unit in which an individual light source is able to be repaired may be provided.

The above-described embodiments of the present disclosure will be briefly described as follows.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A backlight unit comprising:

a glass substrate;

a plurality of pad electrodes on the glass substrate;

a plurality of light sources arranged in a plurality of rows and a plurality of columns on the glass substrate; and a first transistor and a second transistor on the glass substrate, the first transistor and the second transistor spaced apart from each other, wherein each of the first transistor and the second transistor is non-overlapping with the plurality of light sources at points where two rows and two columns cross each other, wherein each of the plurality of light sources is on a pair of pad electrodes, the pair of pad electrodes including a first pad electrode and a second pad electrode that is spaced apart from the first pad electrode and point-symmetrically located with the first pad electrode, wherein a pair of repair patterns are disposed on the glass substrate and disposed adjacent to the pair of pad electrodes, the pair of repair patterns including a first repair pattern that is adjacent to the first pad electrode and a second repair pattern that is adjacent to the second pad electrode, the first repair pattern and the second repair pattern are spaced apart from each other and point-symmetrically located, wherein a reference point at which the first pad electrode and the second pad electrode are point-symmetrically located and a reference point at which the first repair pattern and the second repair pattern are point-symmetrically located correspond to each other, and wherein central axes of light sources on the first pad electrode and the second pad electrode among the plurality of light sources are a same as central axes of light sources on the first repair pattern and the second repair pattern among the plurality of light sources.

2. The backlight unit of claim 1, wherein a first solder pattern is on the first pad electrode, a second solder pattern is disposed on the second pad electrode, and a light source from the plurality of light sources is on the first solder pattern and the second solder pattern.

3. The backlight unit of claim 1, wherein the first transistor is a driving transistor, and the second transistor is a switching transistor.

4. The backlight unit of claim 3, wherein the first transistor and the second transistor are electrically connected to the plurality of light sources.

5. The backlight unit of claim 3, further comprising:
a third pad electrode and a fourth pad electrode on the glass substrate, the third pad electrode and the fourth pad electrode spaced apart from each other;
a first insulating layer on the third pad electrode and the fourth pad electrode and exposing a portion of an upper surface of each of the third pad electrode and the fourth pad electrode;
wherein the first pad electrode is on the first insulating layer and the third pad electrode;
wherein the second pad electrode is on the first insulating layer and the fourth pad electrode; and
a second insulating layer on the first pad electrode and the second pad electrode and exposing a portion of an upper surface of each of the first pad electrode and the fourth pad electrode.

6. The backlight unit of claim 5, wherein at least one first insulating layer pattern is between the first pad electrode and the third pad electrode and between the second pad electrode and the fourth pad electrode in a region where the first insulating layer exposes the portion of the upper surface of each of the third pad electrode and the fourth pad electrode.

7. The backlight unit of claim 3, further comprising:
a first semiconductor chip pad electrode on the glass substrate;
a first insulating layer on the first semiconductor chip pad electrode and exposing a portion of an upper surface of the first semiconductor chip pad electrode;
a second semiconductor chip pad electrode on the first insulating layer and the first semiconductor chip pad electrode; and
a second insulating layer on the second semiconductor chip pad electrode and exposing a portion of an upper surface of the second semiconductor chip pad electrode.

8. The backlight unit of claim 7, wherein a first insulating layer pattern is between the first semiconductor chip pad electrode and the second semiconductor chip pad electrode in a region where the first insulating layer exposes the portion of the upper surface of the first semiconductor chip pad electrode.

9. The backlight unit of claim 3, wherein the second transistor includes a gate electrode, an active layer, a source electrode, and a drain electrode,
wherein the gate electrode is disposed on the glass substrate,
a first insulating layer is on the gate electrode,
the active layer is on the first insulating layer, and
the source electrode and the drain electrode are spaced apart from each other and are on the active layer.

10. The backlight unit of claim 1, further comprising a first transistor, a second transistor, and a third transistor on the glass substrate and surrounded by some light sources from the plurality of light sources,
wherein the first transistor is a driving transistor,
the second transistor is a switching transistor, and
the third transistor is a sense transistor.

11. The backlight unit of claim 10, wherein the first transistor, the second transistor, and the third transistor are electrically connected to the plurality of light sources.

12. The backlight unit of claim 10, comprising:
a third pad electrode and a fourth pad electrode on the glass substrate, the third pad electrode and the fourth pad electrode spaced apart from each other;
a third insulating layer on the third pad electrode and the fourth pad electrode and exposing a portion of an upper surface of each of the third pad electrode and the fourth pad electrode;
a first insulating layer on the third insulating layer;
wherein the first pad electrode is on the first insulating layer, the third insulating layer, and the third pad electrode;
wherein the second pad electrode is on the first insulating layer, the third insulating layer, and the fourth pad electrode; and
a second insulating layer on the first pad electrode and the second pad electrode and exposing a portion of an upper surface of each of the first pad electrode and the fourth pad electrode.

13. The backlight unit of claim 12, wherein a portion of the first pad electrode and a portion of the third pad electrode are in contact with each other, and a portion of the second pad electrode and a portion of the fourth pad electrode are in contact with each other in regions where the first insulating layer and the third insulating layer expose the portion of the upper surface of each of the third pad electrode and the fourth pad electrode.

14. The backlight unit of claim 10, further comprising:
a first semiconductor chip pad electrode on the glass substrate;
a third insulating layer on the first semiconductor chip pad electrode and exposing a portion of an upper surface of the first semiconductor chip pad electrode;
a first insulating layer on the third insulating layer;
a second semiconductor chip pad electrode on the first insulating layer, the third insulating layer, and the first semiconductor chip pad electrode; and
a second insulating layer on the second semiconductor chip pad electrode and exposing a portion of an upper surface of the second semiconductor chip pad electrode.

15. The backlight unit of claim 14, wherein a solder pattern is on the second semiconductor chip pad electrode, and the first transistor is on the solder pattern.

16. The backlight unit of claim 10, wherein each of the second transistor and the third transistor includes a gate electrode, an active layer, a source electrode, and a drain electrode, wherein the active layer of each of the second transistor and the third transistor is on the glass substrate, a first insulating layer is on the active layer of each of the second transistor and the third transistor, and the source electrode, the drain electrode, and the gate electrode of each of the second transistor and the third transistor are on the first insulating layer and spaced apart from each other.

17. The backlight unit of claim 1, wherein a direction in which long axes of the light sources on the first pad electrode and the second pad electrode extend is different from a direction in which long axes of the light sources on the first repair pattern and the second repair pattern extend.

18. A display device comprising:

a substrate of a backlight unit;

at least a pair of pad electrodes on the substrate of the backlight unit;

a light source on the at least the pair of pad electrodes;

a color conversion sheet on the light source; and a display panel on the color conversion sheet, wherein a pair of repair patterns are adjacent to the at least the pair of pad electrodes, wherein the at least the pair of pad electrodes include a first pad electrode and a second pad electrode that is spaced apart from the first pad electrode and point-symmetrically located with the first pad electrode, wherein the pair of repair patterns include a first repair pattern that is adjacent to the first pad electrode and a second repair pattern that is adjacent to the second pad electrode, wherein the first repair pattern and the second repair pattern are spaced apart from each other and point-symmetrically located, wherein a reference point at which the first pad electrode and the second pad electrode are point-symmetrically located and a reference point at which the first repair pattern and the second repair pattern are point-symmetrically located correspond to each other, and wherein central axes of light sources on the first pad electrode and the second pad electrode are a same as central axes of the light sources on the first repair pattern and the second repair pattern.

* * * * *